(12) United States Patent
Reilly et al.

(10) Patent No.: US 7,719,768 B2
(45) Date of Patent: May 18, 2010

(54) OPTICAL BEAM SPLITTER APPARATUS

(75) Inventors: Declan Reilly, Ipswich (GB); Simon Meadowcroft, Stowmarket (GB)

(73) Assignee: Avago Technologies Fiber IP (Singapore) Pte. Ltd., Singapore (SG)

( * ) Notice: Subject to any disclaimer, the term of this patent is extended or adjusted under 35 U.S.C. 154(b) by 1176 days.

(21) Appl. No.: 10/770,488

(22) Filed: Feb. 4, 2004

(65) Prior Publication Data

US 2004/0170207 A1 Sep. 2, 2004

(30) Foreign Application Priority Data

Feb. 5, 2003 (EP) .................... 03250745

(51) Int. Cl.
*G02B 27/14* (2006.01)
*G02B 27/10* (2006.01)
*G02B 27/12* (2006.01)

(52) U.S. Cl. .............. 359/629; 359/627; 359/636; 359/639

(58) Field of Classification Search .......... 359/618, 359/622, 627, 629, 636, 639
See application file for complete search history.

(56) References Cited

U.S. PATENT DOCUMENTS

| 4,444,464 A | * | 4/1984 | Minott | ............... 359/583 |
| 5,105,433 A | | 4/1992 | Schilling | |
| 5,671,047 A | * | 9/1997 | Curbelo | ............... 356/452 |
| 2001/0053024 A1 | * | 12/2001 | Zhao | ............... 359/495 |
| 2002/0034004 A1 | | 3/2002 | Khoshnevis | |
| 2003/0076766 A1 | * | 4/2003 | Nagata et al. | ......... 369/112.19 |

FOREIGN PATENT DOCUMENTS

WO    WO 02 090881 S    11/2002

* cited by examiner

*Primary Examiner*—Scott J Sugarman
*Assistant Examiner*—Brandi N Thomas

(57) ABSTRACT

An optical beam splitter arrangement comprising two beam splitter mounts one of which is turnable relative to the other by flexing a deformable connection. By controlling the turn angle of rotation it is possible to use the light reflected by one of the beam splitters to monitor the output power of a laser and to use the light reflected by the other beam splitter to monitor the wavelength transmitted by the laser.

21 Claims, 4 Drawing Sheets

OPTICAL BEAM SPLITTER APPARATUS

FIELD OF INVENTION

The present invention relates to optical beam splitters, and in particular to optical beam splitters that can produce two reflected beams, with the angle of reflection of one of the beams being variable.

BACKGROUND ART

The output of a semiconductor laser will vary over time as the characteristics of the device change, and may also vary in response to changes in temperature, etc. It is important for lasers used in optical communications systems that the laser output is stable with regard to the power and the wavelength of the transmitted light. Known systems that are used for monitoring the wavelength and power level of use interferometers, such as, for example, a Mach-Zehnder interferometer, and consequently are expensive and complex.

SUMMARY OF INVENTION

According to a first aspect of the invention, there is provided a beam splitter apparatus comprising a first beam splitter mount and a second beam splitter mount, the first beam splitter mount being coupled to the second beam splitter mount by a deformable connection, the beam splitter apparatus being characterised in that, in use, a force is applied to the second beam splitter mount to rotate the second beam splitter mount relative to the first beam splitter mount. Preferably the rotation of the second beam splitter mount relative to the first beam splitter mount is achieved by flexing the deformable connection.

A deformable connection is one that is sufficiently rigid such that in the absence of the application of any external force, the second beam splitter mount does not move relative to the first beam splitter mount. However, under the application of an external force, the second beam splitter mount can be moved into a desired position such that the position will be maintained once the external force is removed.

The rotation of the second beam splitter mount relative to the first beam splitter mount may be ten degrees or less and preferably is two degrees or less. Preferably the beam splitter apparatus comprises a material having a coefficient of thermal expansion of 8 ppm/K or less. The beam splitter apparatus may comprise a metallic alloy, and a preferred metallic alloy is kovar.

The beam splitter apparatus may further comprise a first beam splitter mounted in the first beam splitter mount and a second beam splitter mounted in the second beam splitter mount, the beam splitter apparatus, in use, being arranged such that the first beam splitter and the second beam splitter receive light emitted by an optical source. Preferably the light reflected by the first beam splitter is used to determine the power output of the light emitted by the optical source and the light reflected by the second beam splitter is used to determine a wavelength property of the light emitted by the optical source.

BRIEF DESCRIPTION OF THE DRAWING

The invention will now be described, by way of example only, with reference to the following Figures in which.

DETAILED DESCRIPTION OF THE DRAWING

Figure 1:
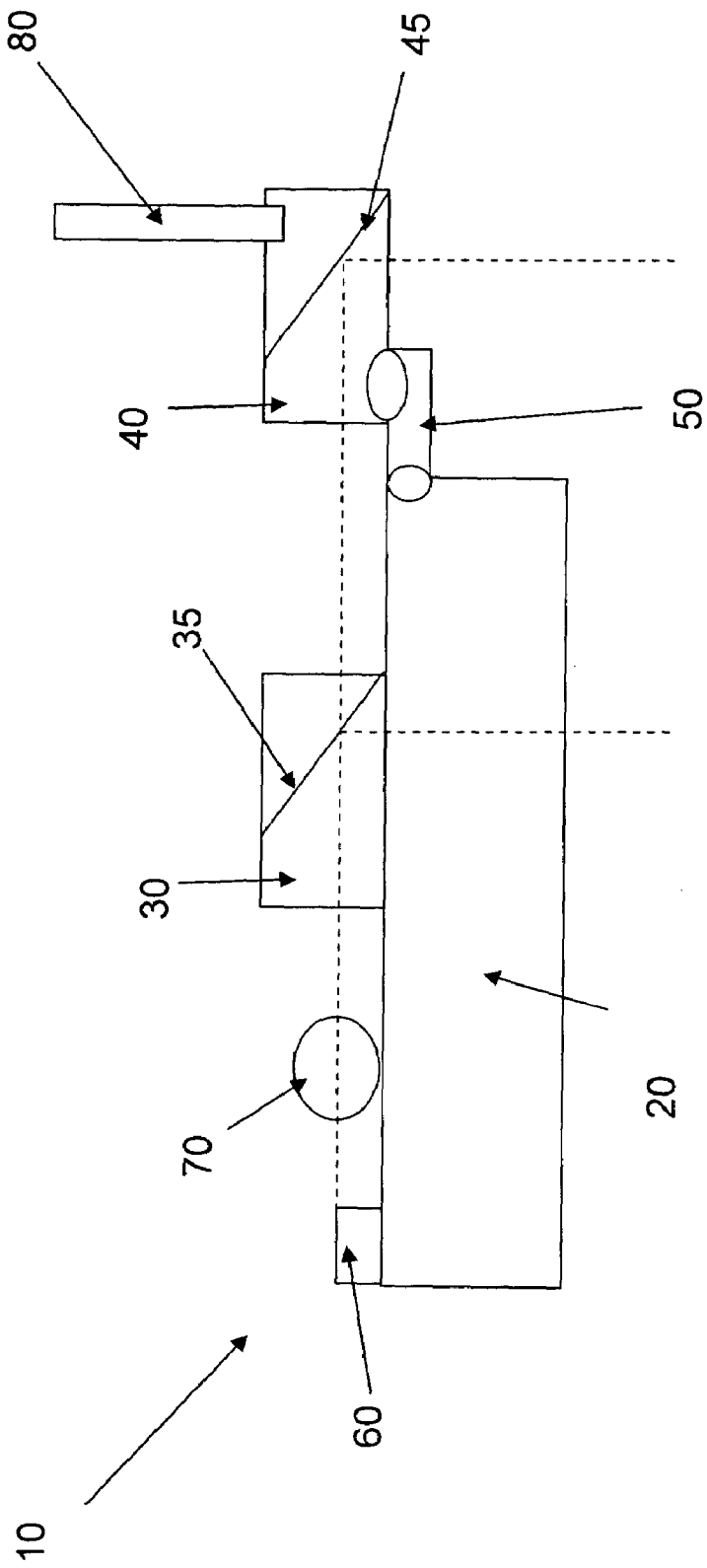
FIG. 1 shows a schematic depiction of a beam splitter apparatus according to the present invention.

FIG. 1 shows a beam splitter apparatus 10 according to the present invention. The beam splitter apparatus 10 comprises base 20, first beam splitter mount 30, second beam splitter mount 40, and deformable connection 50. The first beam splitter mount 30 and second beam splitter 40 mount house first beam splitter 35 and second beam splitter 45 respectively. The base 20 may be adapted to receive a light source 60 and focussing means 70. Additionally, displacement means 80 may be connected to the second beam splitter mount 40.

When the second beam splitter mount 40 is secured in a first position it is substantially parallel with the first beam splitter 60. The light source 60 is arranged to emit light that will be incident on the focussing means 70 and then focussed onto the first beam splitter 30. A fraction of the light incident on the first beam splitter 30 will be reflected at an angle from the incident light path whilst the rest of the light will continue, un-reflected, through the first beam splitter and will be incident on the second beam splitter 40. Similarly, a fraction of the incident light will be reflected by the second beam splitter 40 and the rest of the light will pass through the second beam splitter. When the second beam splitter is secured in the first position then the light reflected by the first beam splitter will be substantially parallel to the light reflected by second beam splitter.

The second beam splitter 40 is coupled to the base 20 by the deformable connection 50. This enables the second beam splitter to be rotated relative to the base such that the angle of incidence of the light transmitted by the laser on the second beam splitter can be varied. This in turn will vary the angle at which the light is reflected from the second beam splitter, relative to the light that is reflected from the first beam splitter.

Figure 2:
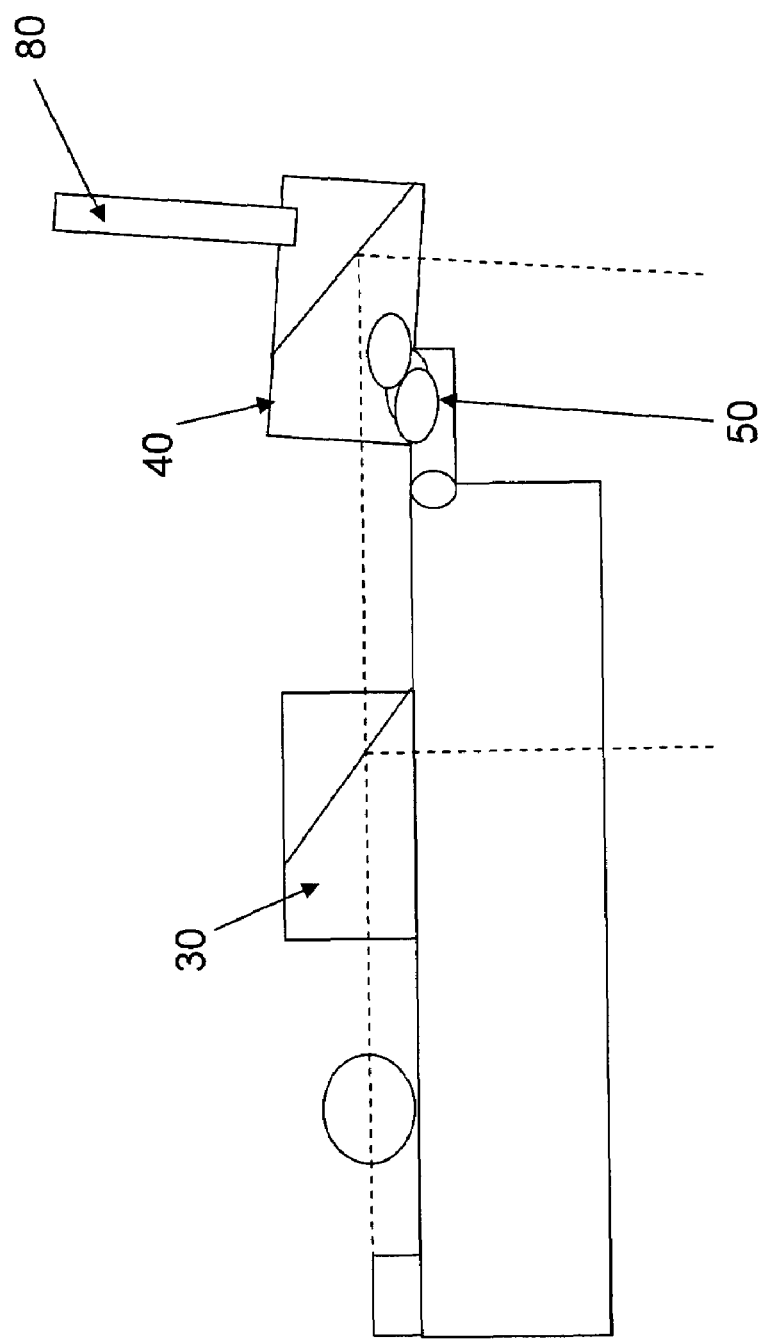
FIG. 2 shows a schematic depiction of a beam splitter apparatus according to the present invention.

Referring to FIG. 2a, if the second beam splitter is rotated in an anti-clockwise direction, then the light reflected from the second beam splitter will diverge from the light reflected from the first beam splitter. Conversely, referring to FIG. 2b, if the second beam splitter is rotated in a clockwise direction, then the light reflected from the second beam splitter will converge towards the light reflected from the first beam splitter.

In a preferred embodiment of the invention, the beam splitting apparatus is formed from kovar, an alloy of cobalt, nickel and iron (typically comprising 17% Co, 29% Ni and 53% Fe). Kovar has been used as it has a low thermal expansion coefficient of 5.5 ppm/K. It is believed that the upper limit to the coefficient of thermal expansion is 8 ppm/K for a material that can be used to manufacture a beam splitter device according to the present invention. It has been found that wire electrodischarge machining (WEDM) is a machining technique that provides sufficient dimensional control for manufacturing the apparatus at a reasonable cost. It has been found that the WEDM process can achieve an accuracy of ±2.5 µm, which is more than acceptable for manufacturing a beam splitter device according to the present invention. Other techniques, such as metal injection moulding, laser cutting, E-beam, chemical machining, etc. would also be suitable if they could provide similar dimensional control. Other materials could be used alternatively if they have suitable thermal qualities and are compatible with the selected manufacturing process: examples of such materials are invar, molybdenum, copper tungsten and an alloy comprising approximately 50% iron and 50% nickel.

The displacement means acts upon the second beam splitter mount 40 such that the material comprising the deformable connection is plastically deformed. This enables the displacement means to move the second beam splitter mount such that it rotates relative to the first beam splitter. It has been found that a force equivalent to 400 g (i.e. approximately 4N) has been sufficient to cause plastic deformation of the material. It has been found that the displacement means 80, which is preferably a micro-manipulator, enables the second beam splitter mount to be rotated by up to 2° relative to the first beam splitter, with the motion of the second beam splitter mount being controlled with a resolution of 3-4 µm. It will be clear that greater rotation of the second beam splitter mount may be obtained dependent upon the needs of the particular application. In order to obtain greater degrees of rotation, for example of up to 10 degrees, it may be necessary to alter the deformable connection in order that the higher stresses do not cause the connection to fracture.

The apparatus may be secured to a surface using one of a range of joining techniques, but some form of welding, for example laser welding, resistance welding, projection welding, etc is preferred over other conventional techniques (such as soldering or the use of adhesives) as there is a significantly reduced chance of creep. The light source 60 and focussing means 70 shown in FIG. 1 may be provided on the surface and the beam splitter apparatus may be secured on the surface so as to be aligned with the light source and focussing means.

Figure 3:
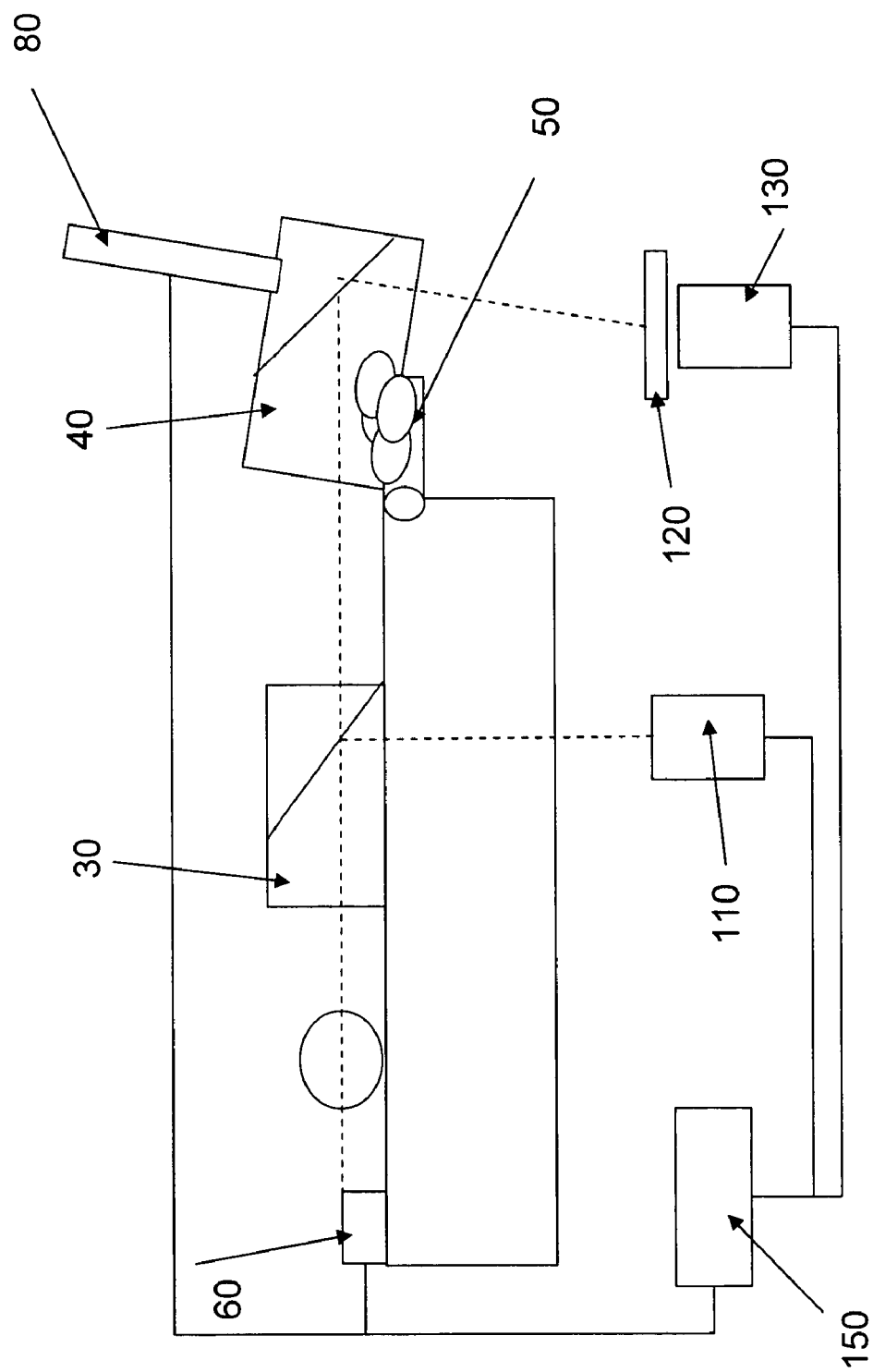
FIG. 3 shows a schematic depiction of a beam splitter apparatus according to the present invention.

FIG. 3 shows an application for which a beam splitter arrangement according to the present invention is particularly suited. A first photodetector 110 is arranged to receive the light reflected by the first beam splitter. An etalon 120 and a second photodetector 130 is arranged such that the light reflected by the second beam splitter is incident upon a surface of the etalon 120 and the output of the etalon is received by the second photodetector 130. The electrical signal generated by the first photodetector is indicative of the power output of the light source 60 and is sent to control unit 150 to ensure that the power output of the light source is kept within acceptable limits. The second photodetector receives an optical signal that has passed through the etalon and this signal will have a generally sinusoidal form as the wavelength of the signal varies. The rotation of the second beam splitter mount can be set such that the transmission of a desired wavelength coincides with an easily detectable point of the sinusoidal waveform such as, for example, the point of inflection where the waveform changes from positive to negative (or vice versa). The electrical signal from the second photodetector may be sent to the control unit such that the optical source is controlled to transmit at the desired wavelength (or within acceptable limits of that wavelength), for example by applying heating or cooling to the optical source. Force transducers may be fitted to the displacement means with a feedback path to the control unit such that the force applied by the displacement means and the rotation of the second beam mount may be monitored and controlled.

Figure 4:
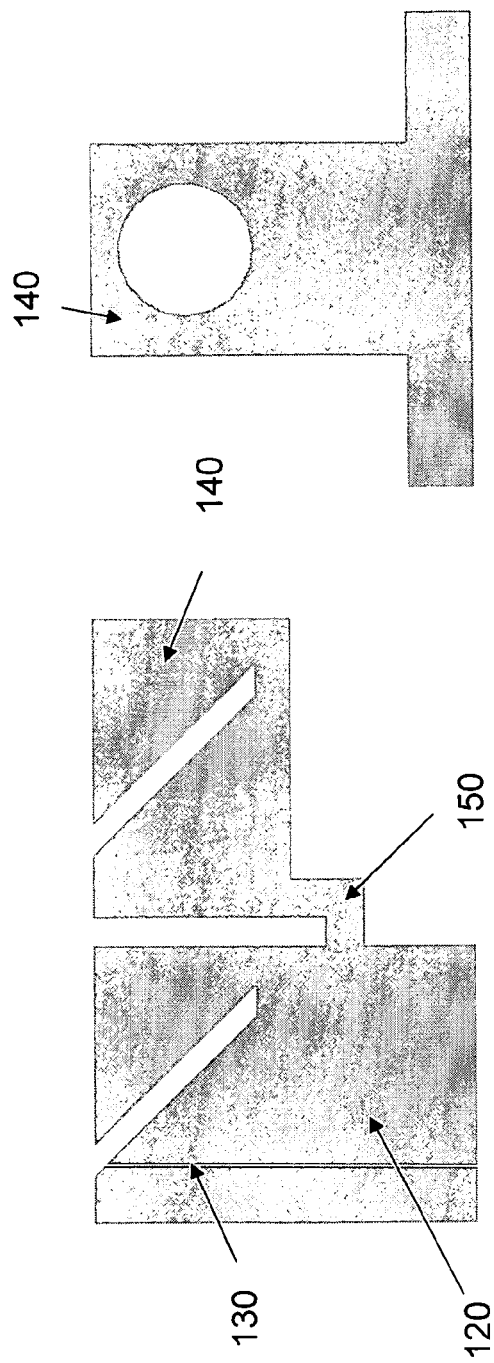
FIG. 4 shows a schematic depiction of a further embodiment of a beam splitter apparatus according to the present invention.
Figure 4:
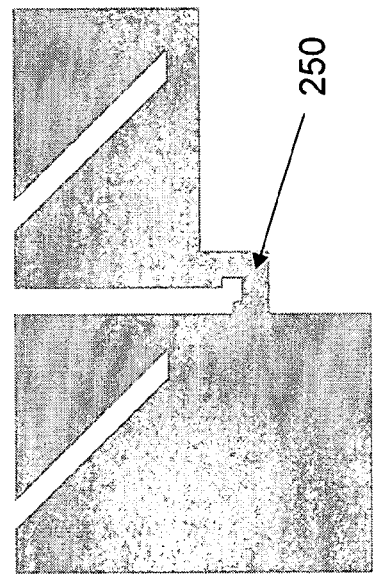

FIGS. 4a and 4b show a schematic depiction of a second embodiment of the present invention in which the second beam splitter mount 140 is connected to the base 120 by deformable connection 150. The length of the beam splitter (that is the distance from the extremity of the first beam splitter 130 to the opposed extremity of the second beam splitter 140 as shown in FIG. 4a) is 3 mm and the width of the beam splitter mounts 130 and 140 (as shown in FIG. 4b) is 0.6 mm. It will be understood that these dimensions are given by way of example only and that the beam splitter apparatus could be of almost any size, depending upon the nature of the application for which it is used.

The dimensions of the deformable connection must be such that the force applied by the displacement means creates a stress in the deformable connection that is greater than the yield stress of the material. For example, for a beam splitter apparatus made from kovar, the cross section area of the deformable section must be sized so that the load applied creates a stress in excess of 340N/mm². Typically the cross-sectional area of the deformable connection may vary from 0.1 to 1 mm², but it will be understood that the cross-sectional area may be greater than or less than these limits depending upon the material used to make the beam splitter apparatus and the nature of the application in which the apparatus is to be used.

FIG. 4c shows a schematic depiction of a third embodiment according to the present invention in which material has been removed from the deformable connection 250 in order to facilitate the flexure of the deformable connection. It is also possible to add material to the deformable connection in order to provide greater resistance to the bending of the deformable connection. The exact shape and size of the deformable connection will need to be selected to provide the desired range of rotation and a suitable force-rotation characteristic.

The invention claimed is:

1. A beam splitter apparatus comprising a first beam splitter mount and a second beam splitter mount, the first beam splitter mount being coupled to the second beam splitter mount by a deformable connection, the beam splitter apparatus being arranged so that a force applied to the second beam splitter mount causes the second beam splitter mount to turn relative to the first beam splitter mount.

2. The beam splitter apparatus of claim 1, wherein the second beam splitter mount is arranged to turn relative to the first beam splitter mount in response to flexing of the deformable connection.

3. The beam splitter apparatus of claim 2 wherein the second beam splitter mount is arranged to turn relative to the first beam splitter mount through an angle of ten degrees or less.

4. The beam splitter apparatus of claim 2 wherein the second beam splitter mount is arranged to turn relative to the first beam splitter mount through an angle of two degrees or less.

5. The beam splitter apparatus of claim 3 wherein the beam splitter apparatus comprises a material having a coefficient of thermal expansion of 8 ppm/K or less.

6. The beam splitter apparatus of claim 5 wherein the beam splitter apparatus comprises kovar.

7. The beam splitter apparatus of claim 6 wherein the beam splitter apparatus further comprises a first beam splitter mounted in the first beam splitter mount and a second beam splitter mounted in the second beam splitter mount, the beam splitter apparatus, in use, being arranged such that the first beam splitter and the second beam splitter receive optical energy emitted by an optical source.

8. The beam splitter apparatus of claim 7, wherein, in use, the optical energy reflected by the first beam splitter is adapted to be used to determine the output power of the optical energy emitted by the optical source and the optical energy reflected by the second beam splitter is adapted to be used to determine a wavelength property of the optical energy emitted by the optical source.

9. The beam splitter apparatus of claim 1 wherein the second beam splitter mount is arranged to turn relative to the first beam splitter mount through an angle of ten degrees or less.

10. The beam splitter apparatus of claim 1 wherein the second splitter mount is arranged to turn relative to the first beam splitter mount through an angle of two degrees or less.

11. The beam splitter apparatus according to claim 1 wherein the beam splitter apparatus comprises a material having a coefficient of thermal expansion of 8 ppm/K or less.

12. The beam splitter apparatus of claim 1, wherein the beam splitter apparatus comprises kovar.

13. The beam splitter apparatus of claim 1 wherein the beam splitter apparatus further comprises a first beam splitter mounted in the first beam splitter mount and a second beam splitter mounted in the second beam splitter mount, the beam splitter apparatus, in use, being arranged such that the first beam splitter and the second beam splitter receive optical energy emitted by an optical source.

14. The beam splitter apparatus of claim 13, wherein, in use, the optical energy reflected by the first beam splitter is adapted to be used to determine the output power of the optical energy emitted by the optical source and the optical energy reflected by the second beam splitter is adapted to be used to determine a wavelength property of the optical energy emitted by the optical source.

15. A method of controlling a beam comprising directing the beam so it is incident on a first beam splitter and then on a beam deflector so that the beam is incident on the first beam splitter and a portion of the beam is then incident in the beam deflector, the first beam splitter and the beam deflector being on different first and second mounts arranged so the portion of the beam incident on the beam deflector propagates longitudinally from the first beam splitter to the beam deflector respectively, the method comprising:
turning the beam deflector through an angle relative to the longitudinal propagation direction by deforming a connection between the beam deflector and the second mount.

16. The method of claim 15 wherein the connection is deformed to cause the beam deflector to turn through an angle of ten degrees or less.

17. The method of claim 15 wherein the connection is deformed to cause the beam deflector to turn through an angle of two degrees or less.

18. The method of claim 15 wherein the first beam splitter deflects another portion of the beam incident on it and is not incident on the beam deflector, further comprising:
indicating the power in the beam incident on the first beam splitter by measuring the power in the beam deflected by the first beam splitter.

19. The method of claim 18 further comprising indicating the wavelength of the beam incident on the first beam splitter by measuring the wavelength of the beam deflected by the beam deflector.

20. The method of claim 15 further comprising indicating the wavelength of the beam incident on the first beam splitter by measuring the wavelength of the beam deflected by the beam deflector.

21. The method of claim 15 wherein the beam deflector is a second beam splitter.

* * * * *